(12) United States Patent
You et al.

(10) Patent No.: US 11,163,025 B2
(45) Date of Patent: Nov. 2, 2021

(54) TELESCOPING MAGNETIC RESONANCE COIL FOR MAGNETIC RESONANCE IMAGING APPARATUS

(71) Applicant: Siemens Healthcare GmbH, Erlangen (DE)

(72) Inventors: Jun You, Shenzhen (CN); Wen Ming Li, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/135,230

(22) Filed: Sep. 19, 2018

(65) Prior Publication Data

US 2019/0086490 A1    Mar. 21, 2019

(30) Foreign Application Priority Data

Sep. 19, 2017    (CN) .......................... 201710846935.5

(51) Int. Cl.
| | |
|---|---|
| *G01R 33/34* | (2006.01) |
| *G01R 33/3875* | (2006.01) |
| *G01R 33/3415* | (2006.01) |

(52) U.S. Cl.
CPC .  *G01R 33/34084* (2013.01); *G01R 33/34007* (2013.01); *G01R 33/3415* (2013.01); *G01R 33/3875* (2013.01)

(58) Field of Classification Search
CPC .......... G01R 33/34084; G01R 33/3415; G01R 33/34007; G01R 33/3875; G01R 33/34; A61B 5/055
See application file for complete search history.

(56) References Cited

U.S. PATENT DOCUMENTS

| | | | | |
|---|---|---|---|---|
| 4,052,661 A | * | 10/1977 | Higham ............. | G01R 33/3628 324/322 |
| 5,049,821 A | * | 9/1991 | Duensing ............. | G01R 33/341 324/318 |

(Continued)

FOREIGN PATENT DOCUMENTS

| | | |
|---|---|---|
| CN | 103344927 A | 10/2013 |
| CN | 103389480 A | 11/2013 |

(Continued)

OTHER PUBLICATIONS

Office Action dated Jul. 3, 2020 issued for Chinese Patent Application No. 201710846935.5.

*Primary Examiner* — Akm Zakaria
(74) *Attorney, Agent, or Firm* — Schiff Hardin LLP

(57) ABSTRACT

A telescoping magnetic resonance coil for a magnetic resonance imaging apparatus has a first coil half in a first coil housing, having a first coil support and a number of first coil units on the first coil support. The telescoping coil also has a second coil half in a second coil housing, having a second coil support and a number of second coil units on the second coil support. One end of the first coil housing is opposite to and slidable relative to one end of the second coil housing, and one end of the first coil support is opposite to and slidable relative to one end of the second coil support. The first coil units at the one end of the first coil support have connections to which sliding contacts of the second coil units at the one end of the second coil support are electrically connectable. The connections are slidable on the sliding contacts, and each of the sliding contacts is provided with a frequency compensation element that maintains a magnetic resonance frequency of the coil at a constant value.

7 Claims, 8 Drawing Sheets

(56) References Cited

U.S. PATENT DOCUMENTS

| | | | | |
|---|---|---|---|---|
| 5,341,117 | A | * | 8/1994 | Singbartl ................ G01P 1/026 |
| | | | | 324/173 |
| 5,489,847 | A | * | 2/1996 | Nabeshima ...... G01R 33/34053 |
| | | | | 324/318 |
| 2013/0144156 | A1 | * | 6/2013 | Boulant ............. G01R 33/5612 |
| | | | | 600/410 |
| 2013/0300418 | A1 | | 11/2013 | Eberler et al. |
| 2018/0017643 | A1 | * | 1/2018 | Zink ........................ H03J 3/24 |

FOREIGN PATENT DOCUMENTS

| | | |
|---|---|---|
| CN | 106980097 A | 7/2017 |
| CN | 107064839 A | 8/2017 |
| CN | 108139452 A | 6/2018 |

* cited by examiner

TELESCOPING MAGNETIC RESONANCE COIL FOR MAGNETIC RESONANCE IMAGING APPARATUS

BACKGROUND OF THE INVENTION

Field of the Invention

The present invention relates to a telescoping magnetic resonance (MR) coil, and a magnetic resonance imaging apparatus having a telescopic coil.

Description of the Prior Art

Magnetic resonance imaging (MRI) is a biomagnetic nuclear spin imaging technology that has developed rapidly with the development of computer technology, electronic circuit technology and superconductor technology. For this purpose, an MR scanner is updated by a control computer so as to produce magnetic fields and radio-frequency pulses to resonate hydrogen nuclei (i.e., H+) precessing in a human tissue so as to generate radio-frequency signals, which are converted into an image by computer processing. When placed in a magnetic field, an object is irradiated with electromagnetic energy at an appropriate frequency and thereby hydrogen nuclei resonate, and emit electromagnetic MR signals, which are spatially encoded by gradient fields so that it is possible to know the positions and types of the nuclei constituting the object. Thus an accurate image of the interior of the object can be produced. For example, a series of consecutive slices obtained from the human brain can be scanned by magnetic resonance imaging.

In the MR scanner, a transmitting coil transmits a radio-frequency pulse to achieve magnetic resonance of the relevant nuclei. A local coil that can be placed on the examination subject in the scanner, receives the magnetic resonance signals and sends the magnetic resonance signals to a receiving coil channel selector (RCCS) and a receiver. For conventional local coils, whether a hard coil or a flexible coil, the size thereof is constant, and therefore, when placed on different subjects, sometimes the local coil may not completely cover the intended position that is to be imaged or the coil is so large as to partially overlap regions outside of the desired image region, so that MR signals are received from a part of the subject that is not desired to be imaged. Both these drawbacks affect the final magnetic resonance imaging.

SUMMARY OF THE INVENTION

An object of the present invention is to provide a telescoping magnetic resonance coil that is capable of adapting to different subjects and capable of ensuring reception of MR signals only for the desired imaging.

This object is achieved by a telescoping magnetic resonance coil in accordance with the invention that has a first coil half and a second half that fit together in a telescoping manner. The first coil half has a first coil housing that has a first coil support and a number of first coil units on the first coil support. The second coil half has a second coil housing having a second coil support and a number of second coil units on the second coil support. One end of the first coil housing is opposite to and slidable relative to one end of the second coil housing, and one end of the first coil support is opposite to and slidable relative to one end of the second coil support. The first coil units at the one end of the first coil support have connections, the second coil units at the one end of the second coil support have sliding contacts electrically connectable to those connections, with the connections being slidable on the sliding contacts. Each of the sliding contacts has a frequency compensation element that maintains a magnetic resonance frequency of the coil at a constant value.

It is preferred in the aforementioned telescoping magnetic resonance coil that the frequency compensation element is a variable-capacitance element or a number of capacitance elements connected in series.

It is preferred in the aforementioned telescoping magnetic resonance coil that the variable-capacitance element is a variable resistor and a voltage-controlled capacitor.

It is preferred in the aforementioned telescoping magnetic resonance coil that the first coil units at the one end of the first coil support and the second coil units at the one end of the second coil support form a complete coil unit by electrically connecting the connections to the sliding contacts.

It is preferred in the aforementioned telescoping magnetic resonance coil that the first coil support has a rack groove composed of a number of continuous serrations, and the second coil support has a positioning protrusion capable of engaging with the serrations. The positioning protrusion positions the first coil support and the second coil support relative to each other when they slide relative to each other.

The present invention also encompasses a magnetic resonance imaging apparatus having a telescoping magnetic resonance coil as described above.

The magnetic resonance coil according to the present embodiment can adapt to the requirements of various types of subjects, and can better match the detected position. By providing the frequency compensation element, it is possible to maintain the same resonance frequency as before, thereby achieving a better magnetic resonance detection effect than ever before.

DESCRIPTION OF THE PREFERRED EMBODIMENTS

As used herein, the term "exemplary" means "serving as an example, instance, or description", and any "exemplary" illustration and embodiment herein should not be interpreted as a more preferred or a more advantageous technical solution.

For clarity of the drawings, only the relevant parts of the present utility model are schematically shown throughout the drawings, and they do not represent the actual structure of a product. In addition, in order to make the figures concise and easy to understand, in some figures, there are components of the same structure or function, only one of which is schematically depicted or marked.

Preferred embodiments of the present invention will be described below with reference to the accompanying drawings.

Figure 1A:
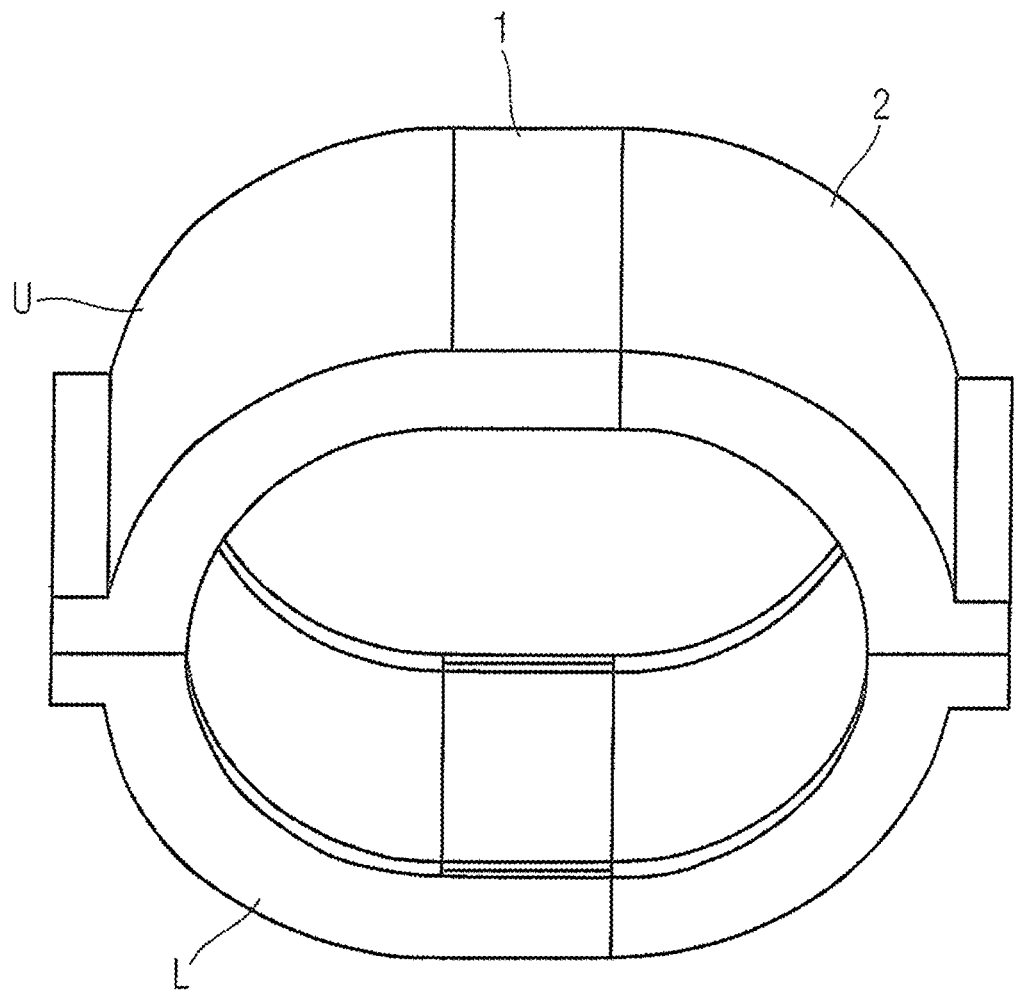
FIG. 1A is a perspective view of a telescoping coil for magnetic resonance imaging in a retracted state according to an embodiment of the present invention.

FIG. 1A is a perspective view of a telescoping coil for magnetic resonance imaging in a retracted state according to an embodiment of the present invention. In this embodiment, the coil is, as an example, a knee coil having an upper coil U and a lower coil L. When in use, the upper coil U and the lower coil L are aligned and assembled in the vertical direction of FIG. 1, and a detected position such as a knee is sandwiched between the upper coil U and the lower coil L, and is fixed via an engagement mechanism (not shown). Herein, since the upper coil U and the lower coil L have the same structure, only the upper coil U will be described as an example. The upper coil U is formed in a substantially arch shape, and comprises a left half coil (first coil) 1 and a right half coil (second coil) 2.

Figure 1B:
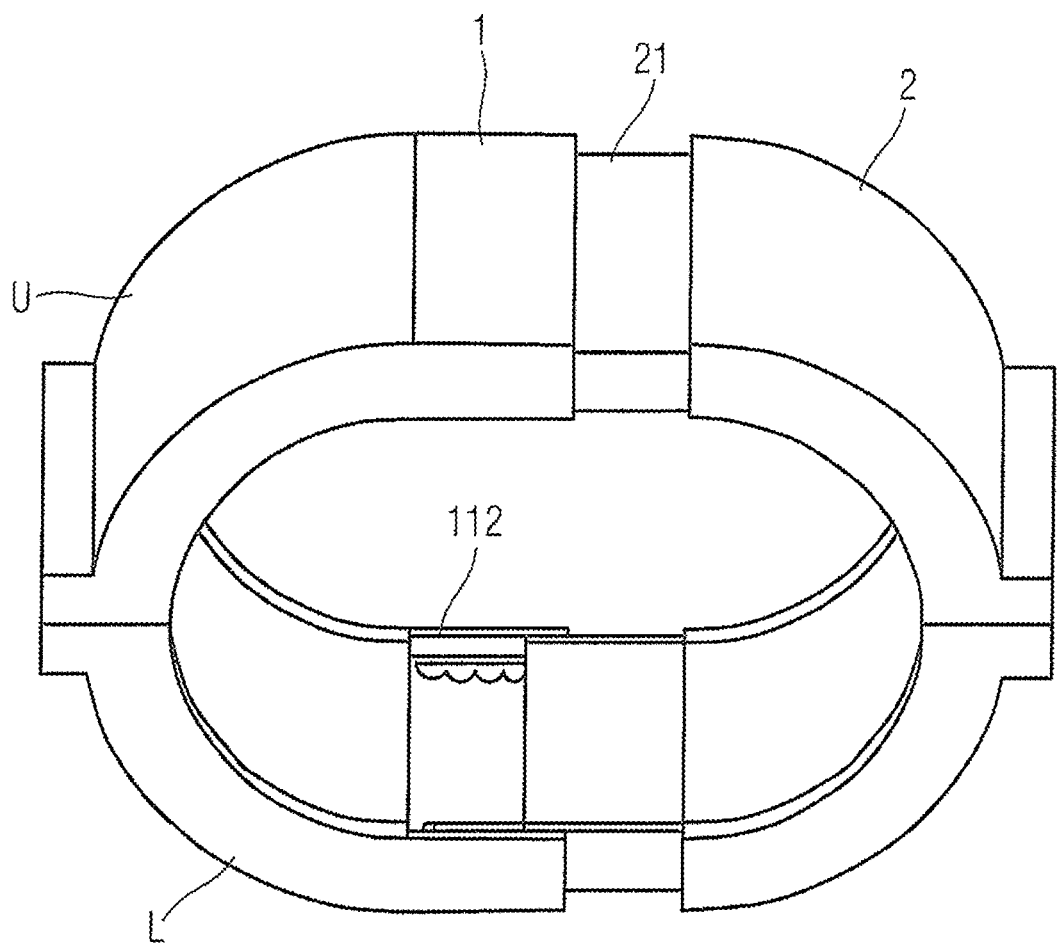
FIG. 1B is a perspective view of a telescoping coil for magnetic resonance imaging in an extended state according to an embodiment of the present invention.
Figure 2:
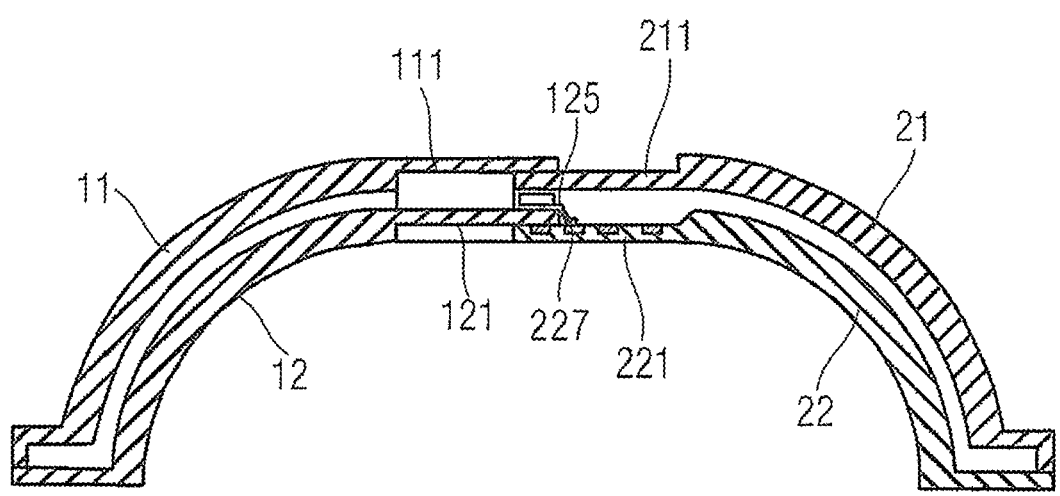
FIG. 2 is a sectional view of an upper coil in accordance with the invention.

FIG. 1B is a perspective view of a telescoping coil for magnetic resonance imaging in an extended state according to an embodiment of the present invention, which in this embodiment can be extended in the horizontal direction of FIG. 1B. As shown in FIGS. 1B and 2, a recess 111 is provided at one end of the left half coil 1, slide grooves 112 are provided on two side walls of the recess, and one end of the right half coil 2 can be inserted into the recess 111 and can slide along slide grooves 112.

The left half coil 1 and the right half coil 2 will be further described below with reference to FIGS. 2 to 4. FIG. 2 is a sectional view of the upper coil U. As shown in FIG. 2, the left half coil 1 has a left half coil housing (first coil housing) 11 and a left coil half (first coil half) 12, and the right half coil 2 has a right half coil housing (second coil housing) 21 and a right coil half (second coil half) 22. The left half coil housing 11 is formed as a thin-walled recess 111 at one end, one end of the right half coil housing 21 is formed as a thin-walled insertion portion 211, and the insertion portion 211 is slidably inserted into the recess 111 and can slide along the slide grooves 112. Furthermore, the left half coil housing 11 and the left coil half 12 are fixed, and the right half coil housing 21 and the right coil half 22 are fixed.

Figure 3:
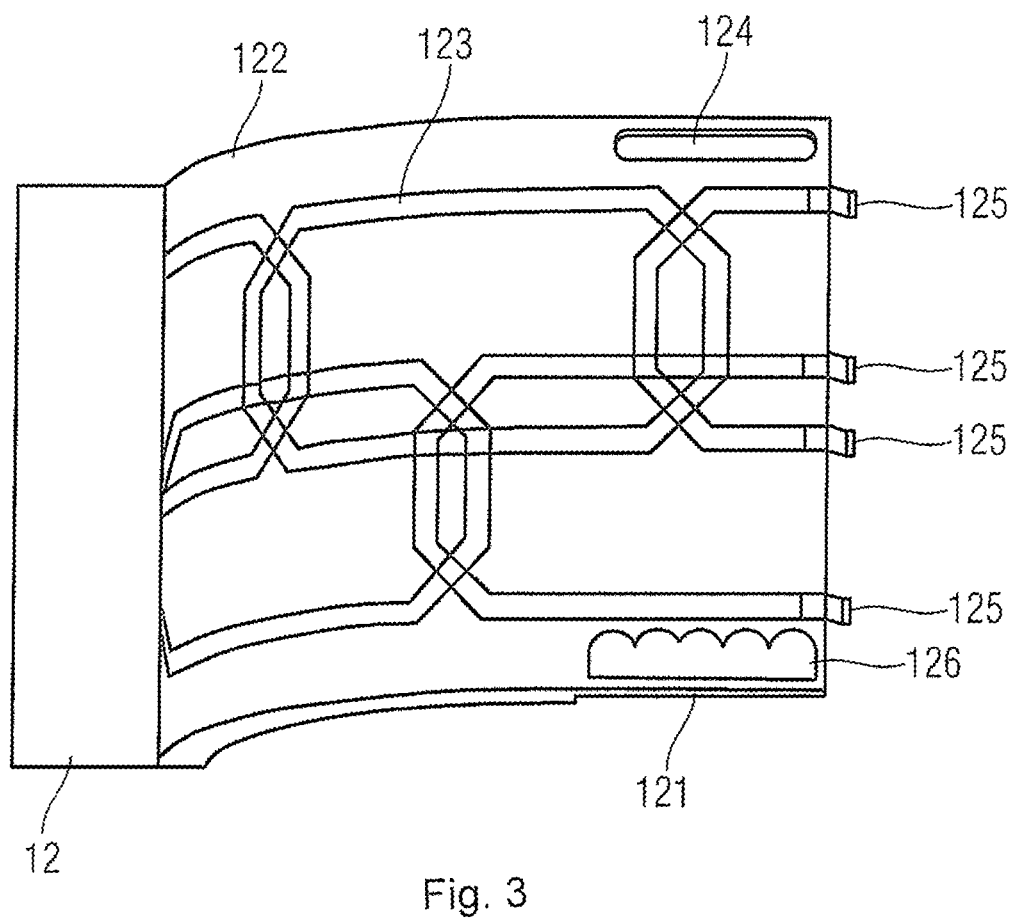
FIG. 3 is a structural view showing a left coil half (first coil half) in accordance with the invention.

FIG. 3 shows a structural view of the left coil half (first coil half) 12. As shown in FIG. 3, one end of the left coil half 12 is formed as a thin-walled portion 121, and the left coil half 12 comprises a left half coil support (first coil support) 122 and a number of left half coil units (first coil units) 123 provided on the surface of the left half coil support 122. The left half coil units 123 are multi-channel flexible coils that are substantially annular and partially crossed and overlapped. The left half coil units 123 provided at one end side of the first coil support 122 have connections 125 which can be electrically connected to right half coil units 223 described later. The connections 125 may be, for example, leaf springs, which protrude slightly from the one end of the first coil support 122 and are slightly curved toward the back of the left half coil support 122. Furthermore, side edges of the left half coil support 122 that are along a telescoping direction of the coil are respectively provided with a long strip-shaped slide groove 124 parallel to the telescoping direction and a rack groove 126 having a rack-like long side.

Figure 4:
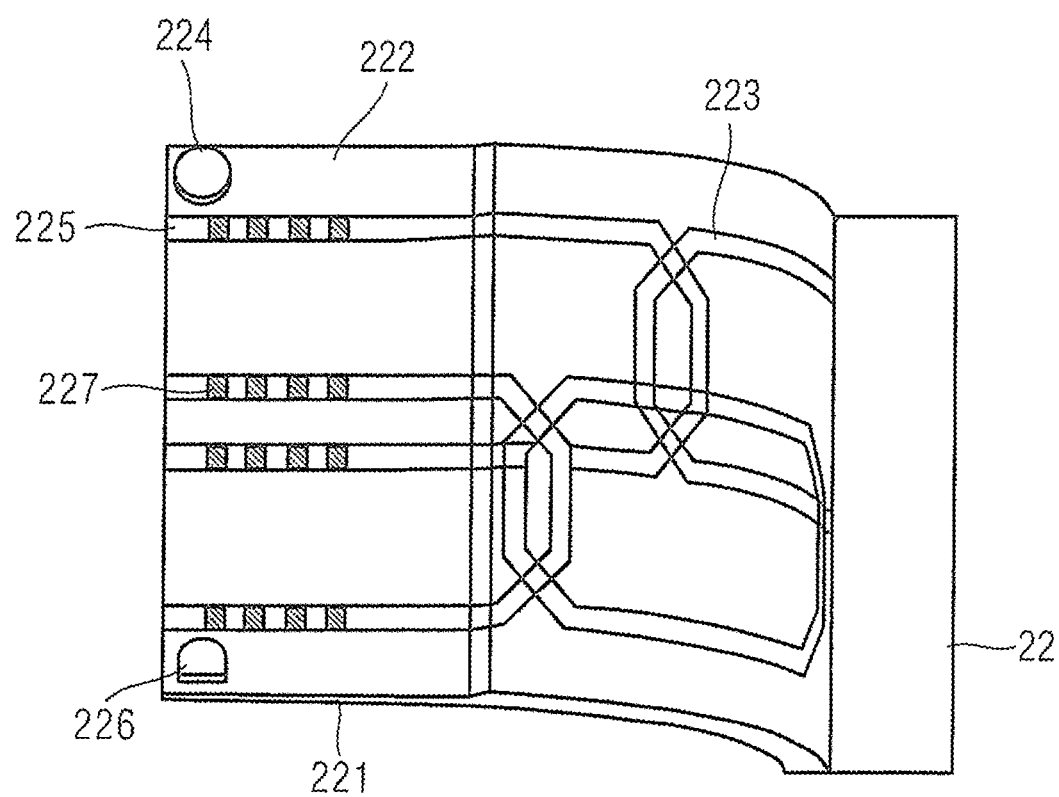
FIG. 4 is a structural view showing a right coil half (second coil half) in accordance with the invention.

FIG. 4 shows a structural view of the right coil half (second coil half) 22. As shown in FIG. 4, one end of the right coil half 22 is formed as a thin-walled portion 221, and the right coil half 22 comprises a right half coil support (second coil support) 222 and a number of right half coil units (second coil units) 223 provided on the surface of the right half coil support 222. The right half coil units 223 are multi-channel flexible coils that are substantially annular and partially crossed and overlapped. The right half coil units 223 provided at one end side of the second coil support 222 have a number of sliding contacts 225 which can be electrically connected to the connections 125 of the left half coil units 123 described above. The sliding contacts 225 are provided parallel to the telescoping direction of the coil, and the length thereof is greater than or equal to the telescoping length of the coil. In this embodiment, a number of capacitance elements (a frequency compensation element) 227 are provided in series on each of the sliding contacts 225. Furthermore, two side edges of the right half coil support 222 that intersect the one end side mentioned above are respectively provided with a positioning pin 224 and a positioning protrusion 226, wherein the positioning pin 224 is engaged with the slide groove 124 of the left coil half 12 and can slide in the slide groove 124, and the positioning protrusion 226 is shaped to be able to engage with the serrations of the rack groove 126 of the left coil half 12.

Figure 5:
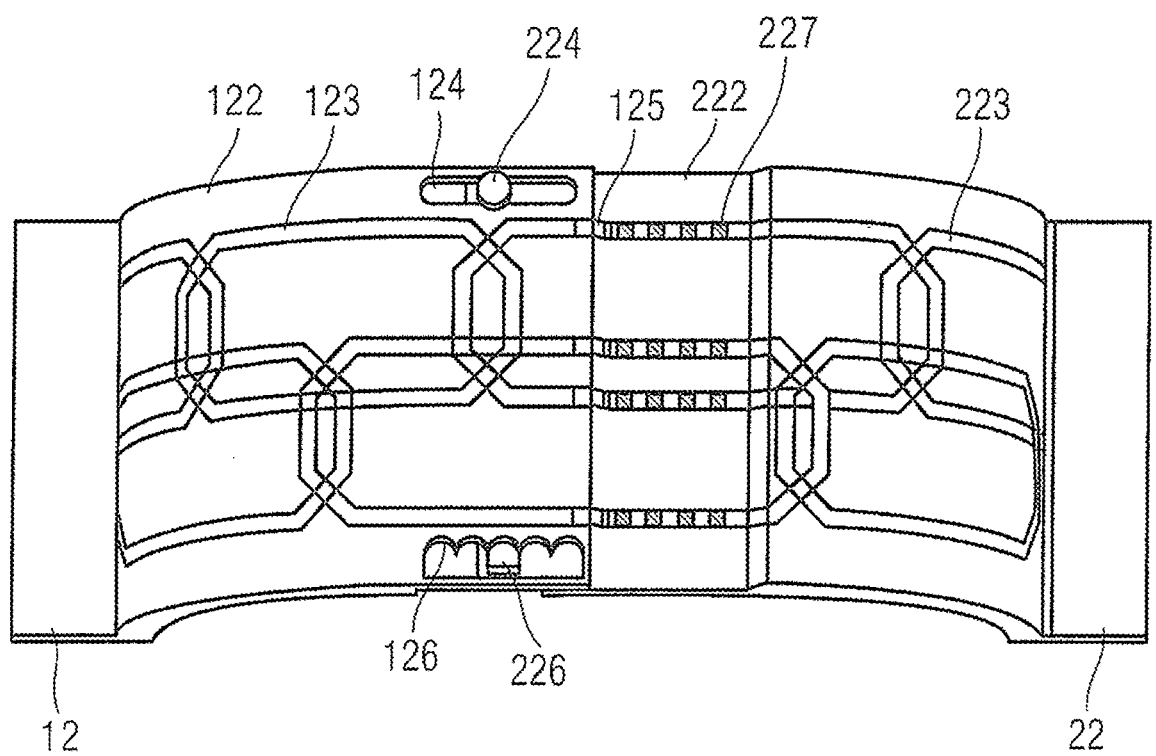
FIG. 5 is a schematic view showing the left coil half and the right coil half being integrally assembled in accordance with the invention.

FIG. 5 shows a schematic view of the left coil half 12 and the right coil half 22 being integrally assembled. As shown in FIG. 5, the thin-walled portion 121 of the left coil half 12 and the thin-walled portion 221 of the right coil half 22 are opposed each other. In this case, the connections 125 of the left half coil units 123 that are located at the thin-walled portion 121 are electrically connected to the sliding contacts 225 of the right half coil units 223 that are located at the thin-walled portion 221. With this electrical connection, the left half coil units 123 with the connections 125 and the right half coil units 223 with the sliding contacts 225 form a complete closed coil unit independently. Furthermore, the positioning pin 224 is engaged with the slide groove 124 and is slidable in the slide groove 124, and the positioning protrusion 226 is engaged with the rack groove 126, so that the left coil half 12 can slide relative to the right coil half 22, and when sliding within the rack groove 126, the positioning protrusion 226 cooperates with the serrated recess provided on the rack-like long side, to enable the left coil half 12 to be positioned at an appropriate position relative to the right coil half 22.

A number of capacitance elements 227 provided in series on the sliding contact 225 will be described below with reference to FIGS. 4 and 5. It is well known that in the magnetic resonance imaging process, the resonance frequency of the coil needs to satisfy the Larmor frequency, i.e.

$$f = \frac{1}{2\pi\sqrt{LC}},$$

the inductance of the coil unit, which is formed, for example, by slidably connecting the left coil units 123 to the right coil units 223 via the connections and the sliding contacts, is for example $L_1$ in the initial state, and when the left coil half 12 slides (extends or retracts) relative to the right coil half 22, the inductance changes to $L_2$ for example at this time. In order to ensure that the resonance frequency of the extended or retracted coil still satisfies the Larmor frequency, it is necessary to satisfy the following equation $$\frac{1}{2\pi\sqrt{L_1 C_1}} = \frac{1}{2\pi\sqrt{L_2 C_2}},$$

and it $L_1 < L_2$, it is necessary to make $C_1 > C_2$. In this embodiment, in order to maintain the constant frequency of the extended or retracted coil, the inventor of the present application solves this problem by providing the plurality of capacitance elements 227 in series on the sliding contact 225. In this way, when the coil is extended or retracted, the inductance L of the coil changes, and at the same time, since the connections 125 slide on the sliding contacts 225, the capacitance C input to the coil unit also changes. As a result, it is ensured that $L_1 C_1$ before the coil is extended or retracted is equal to $L_2 C_2$ after the coil is extended or retracted, so that it is ensured that the resonance frequency of the coil is always maintained at the Larmor frequency. This means, it is ensured that the resonance frequency of the coil after same is extended or retracted can be consistent with the resonance frequency of the coil before same is extended or retracted.

Figure 6:
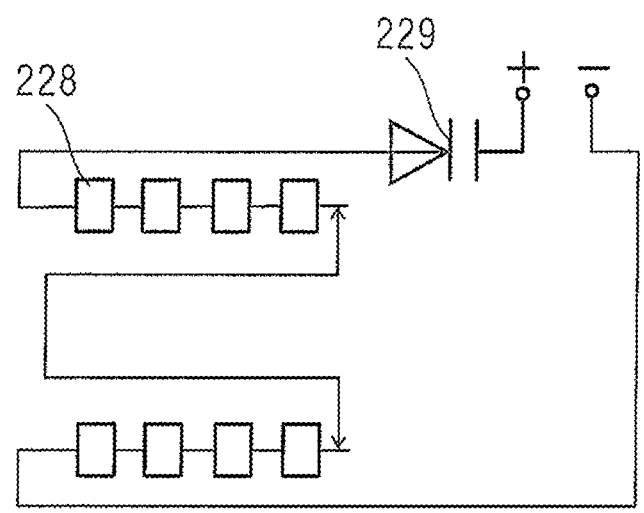
FIG. 6 is an explanatory view showing the structure of a further frequency compensation device in accordance with the invention.

In the above embodiment, the sliding contact 225 is illustrated as being provided with the plurality of capacitance elements 227 as the frequency compensation element, but it is not limited thereto. A voltage-controlled capacitor may be used as the frequency compensation element to change the capacitance input to the coil unit. For example, as shown in FIG. 6, the sliding contact 225 is provided with a variable resistor 228 and a voltage-controlled capacitor 229 connected in series thereto. When the coil is extended or retracted, the resistance of the variable resistor 228 changes, and the value of the voltage applied to the voltage-controlled capacitor 229 also changes correspondingly, whereby the capacitance of the voltage-controlled capacitor 229 also changes. This ensures that the resonance frequency of the coil after same is extended or retracted can be consistent with the resonance frequency of the coil before same is extended or retracted. Of course, other frequency compensation elements may be used in addition to the above embodiments, as long as the frequency of the coil before and after same is extended or retracted can keep a constant Larmor frequency.

Figure 7:
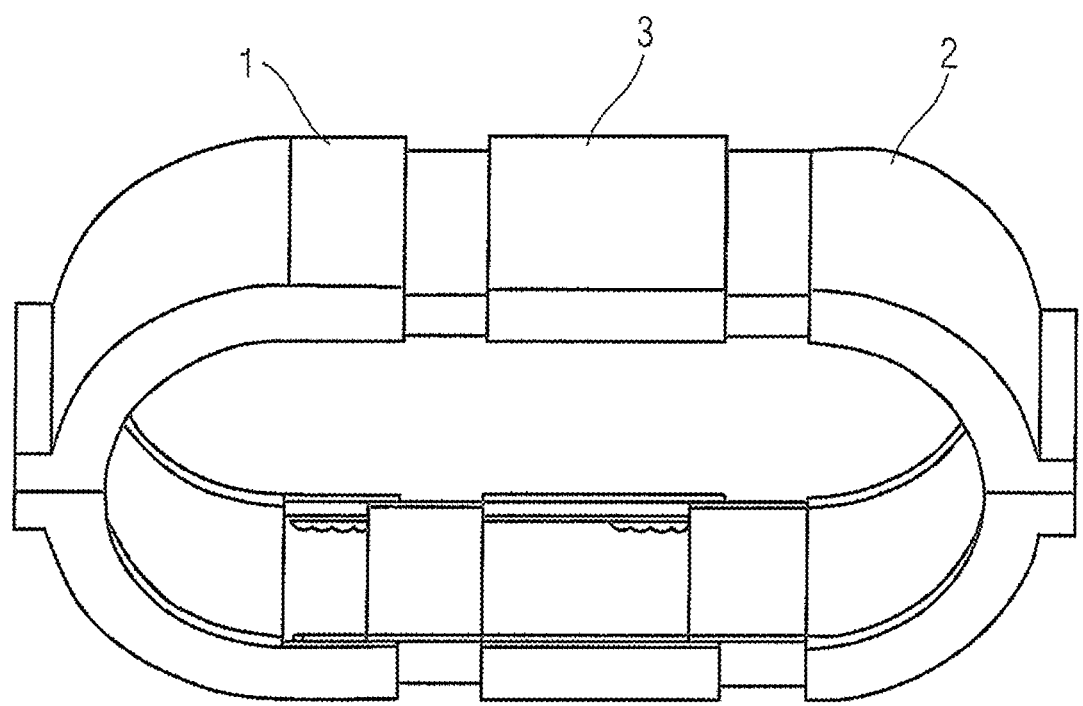
FIG. 7 is a schematic view showing a further embodiment of the telescoping coil of the present invention.

Furthermore, in the above embodiment, the magnetic resonance coil is illustrated as being composed of two parts, namely the left coil half 1 and the right coil half 2, but may also be composed of three parts, namely the left coil half 1, the right coil half 2 and an intermediate coil half 3, as shown in FIG. 7. Of course, more parts may also be comprised.

Furthermore, in the above embodiment, the magnetic resonance coil is illustrated as being extended or retracted in the horizontal direction (the left and right direction of the drawing), but it is not limited thereto. The magnetic resonance coil may also be an arc-shaped coil having an arc and can be extended or retracted along the arc.

Furthermore, in the present invention, the coil unit may be coated on the surface of the coil support by means of LDS (Laser Direct Structuring) technology, in addition to being provided on the coil support by adhesion.

The magnetic resonance coil according to the present embodiment can adapt to the requirements of various types of subjects, and can better match the detected position. By providing the frequency compensation element, it is possible to maintain the same resonance frequency as before, thereby achieving a better magnetic resonance detection effect than ever before.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A telescoping magnetic resonance coil, comprising:
a first coil half in a first coil housing, said first coil half comprising a first coil support and a plurality of first coil units on the first coil support;
a second coil half in a second coil housing, said second coil half comprising a second coil support and a plurality of second coil units provided on the second coil support; and
one end of the first coil housing being opposite to and slidable relative to one end of the second coil housing, and one end of the first coil support being opposite to and slidable relative to one end of the second coil support,
wherein the first coil support comprises a rack groove formed by a plurality of continuous serrations, the second coil support comprises a positioning protrusion shaped to engage the serrations, and the positioning protrusion engaging said serrations so as to position the first coil support and the second coil support when relative to each other when said first coil support and said second coil support slide relative to each other and
wherein the first coil units at said one end of the first coil support have connections, the second coil units at said one end of the second coil support have sliding contacts that are electrically connectable to the connections, the connections being slidable on the sliding contacts, and each of the sliding contacts comprising a frequency compensation element configured to change variable capacitance and to compensate for any change in a magnetic resonance frequency of the telescoping magnetic resonance coil to maintain a constant value for the magnetic resonance frequency.

2. The telescoping magnetic resonance coil as claimed in claim 1, wherein
the frequency compensation element is a variable-capacitance element or a plurality of capacitance elements connected in series.

3. The telescoping magnetic resonance coil as claimed in claim 2, wherein
the variable-capacitance element comprises a variable resistor and a voltage-controlled capacitor.

4. The telescoping magnetic resonance coil as claimed in claim 1, wherein
the first coil units at said one end of the first coil support and the second coil units at said one end of the second coil support forming a complete coil unit by electrically connecting the connections to the sliding contacts.

5. A magnetic resonance imaging apparatus comprising:
a magnetic resonance data acquisition scanner comprising a telescoping magnetic resonance coil;
said telescoping magnetic resonance coil comprising a first coil half in a first coil housing, said first coil half comprising a first coil support and a plurality of first coil units on the first coil support;
said telescoping magnetic resonance coil further comprising a second coil half in a second coil housing, said second coil half comprising a second coil support and a plurality of second coil units provided on the second coil support;
one end of the first coil housing being opposite to and slidable relative to one end of the second coil housing, and one end of the first coil support being opposite to and slidable relative to one end of the second coil support, wherein the first coil support comprises a rack groove formed by a plurality of continuous serrations, the second coil support comprises a positioning protrusion shaped to engage the serrations, and the positioning protrusion engaging said serrations so as to position the first coil support and the second coil support when relative to each other when said first coil support and said second coil support slide relative to each other, and wherein the first coil units at said one end of the first coil support have connections, the second coil units at said one end of the second coil support have sliding contacts that are electrically connectable to the connections, the connections being slidable on the sliding contacts, and each of the sliding contacts comprising a frequency compensation element configured to change variable capacitance and to compensate for any change in a magnetic resonance frequency of the telescoping magnetic resonance coil to maintain a constant value for the magnetic resonance frequency.

6. The telescoping magnetic resonance coil as claimed in claim 1, wherein
a portion of the second coil support has a planar shape with the sliding contacts disposed on one side.

7. The magnetic resonance imaging apparatus as claimed in claim 5, wherein
a portion of the second coil support has a planar shape with the sliding contacts disposed on one side.

\* \* \* \* \*